(12) United States Patent
Wang et al.

(10) Patent No.: US 10,748,848 B2
(45) Date of Patent: Aug. 18, 2020

(54) ELECTRONIC DEVICE

(71) Applicant: Au Optronics Corporation, Hsinchu (TW)

(72) Inventors: Chih-Hao Wang, Hsinchu (TW);
Po-Fu Huang, Taoyuan County (TW);
Shang-Lin Chiang, Hsinchu (TW);
Tsai-Chi Yeh, Yunlin County (TW);
Chih-Hung Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/188,286

(22) Filed: Nov. 13, 2018

(65) Prior Publication Data

US 2019/0385944 A1 Dec. 19, 2019

(30) Foreign Application Priority Data

Jun. 15, 2018 (TW) .............................. 107120717 A

(51) Int. Cl.
*H01L 23/528* (2006.01)
*H01L 23/00* (2006.01)

(52) U.S. Cl.
CPC ............ *H01L 23/528* (2013.01); *H01L 24/09* (2013.01); *H01L 24/32* (2013.01);
(Continued)

(58) Field of Classification Search
CPC .................................................... H01L 23/528
See application file for complete search history.

(56) References Cited

U.S. PATENT DOCUMENTS 5,189,539 A * 2/1993 Suzuki ................ G02F 1/13452
349/150
6,407,795 B1 * 6/2002 Kamizono ........... G09G 3/3611
349/149
(Continued)

FOREIGN PATENT DOCUMENTS

CN 105118386 12/2015
JP 2014186162 10/2014
(Continued)

OTHER PUBLICATIONS

Office Action of Taiwan Counterpart Application, dated Feb. 25, 2019, pp. 1-5.

*Primary Examiner* — William A Harriston
(74) *Attorney, Agent, or Firm* — JCIPRNET

(57) ABSTRACT

An electronic device includes a substrate, first signal lines, pixel structures, first pads, transmission pads, a first combination circuit board, and a transmission circuit board. The first pads are electrically connected to some of a plurality of first signal lines. The transmission pads are electrically connected to some of the first signal lines. The first combination circuit board is disposed between a first side and a second side of the substrate opposite to each other. The transmission circuit board is disposed between the first combination circuit board and the second side of the substrate. The first combination circuit board is electrically connected to at least some of the first pads, and a first pitch exists between the adjacent first pads. The transmission pads are electrically connected to the transmission circuit board, and a transmission-pad pitch exists between the adjacent transmission pads. The transmission-pad pitch is greater than the first pitch.

14 Claims, 6 Drawing Sheets

(52) U.S. Cl.
CPC ............... *H01L 2224/04026* (2013.01); *H01L 2224/0903* (2013.01); *H01L 2224/09132* (2013.01); *H01L 2224/32014* (2013.01); *H01L 2224/32227* (2013.01)

(56) References Cited

U.S. PATENT DOCUMENTS

| | | | | |
|---|---|---|---|---|
| 6,583,844 | B1 * | 6/2003 | Mishima | G02F 1/13452 349/149 |
| 6,583,845 | B1 * | 6/2003 | Chung | G02F 1/13452 349/149 |
| 6,665,037 | B2 * | 12/2003 | Hagiwara | G02F 1/1345 349/139 |
| 6,693,384 | B1 * | 2/2004 | Vicentini | G02F 1/13452 257/668 |
| 7,300,830 | B2 * | 11/2007 | Yoo | H01L 27/1214 438/151 |
| 7,358,955 | B2 | 4/2008 | Lim | |
| 7,385,665 | B2 * | 6/2008 | Matsumoto | G02F 1/13452 174/250 |
| 7,538,278 | B2 | 5/2009 | Chen | |
| 7,764,351 | B2 * | 7/2010 | Moon | G02F 1/13452 349/149 |
| 9,442,588 | B2 * | 9/2016 | Huang | G06F 3/041 |
| 9,625,775 | B2 | 4/2017 | Katagiri et al. | |
| 9,804,457 | B2 * | 10/2017 | Cao | H05K 1/11 |
| 10,216,302 | B2 * | 2/2019 | Morein | G06F 3/0412 |
| 2004/0036833 | A1 * | 2/2004 | Monzen | G02F 1/13452 349/158 |
| 2005/0139382 | A1 | 6/2005 | Chen | |
| 2008/0013029 | A1 * | 1/2008 | Kim | G02F 1/1345 349/150 |
| 2009/0051290 | A1 * | 2/2009 | Song | H01J 11/12 313/582 |
| 2009/0147204 | A1 * | 6/2009 | Kang | G02F 1/13452 349/150 |
| 2009/0153790 | A1 * | 6/2009 | Tashiro | G02F 1/13452 349/149 |
| 2009/0237588 | A1 * | 9/2009 | Takenaka | G02F 1/133308 349/58 |
| 2009/0268146 | A1 * | 10/2009 | Kook | G02F 1/13458 349/149 |
| 2014/0320779 | A1 | 10/2014 | Noumi | |
| 2016/0178952 | A1 | 6/2016 | Katagiri et al. | |
| 2019/0067406 | A1 * | 2/2019 | Lee | H01L 23/544 |
| 2019/0164877 | A1 * | 5/2019 | Cho | H01L 27/124 |
| 2019/0181212 | A1 * | 6/2019 | Koh | H01L 27/3255 |

FOREIGN PATENT DOCUMENTS

| | | |
|---|---|---|
| JP | 2014215464 | 11/2014 |
| TW | I236329 | 7/2005 |
| TW | I585500 | 6/2017 |

* cited by examiner

ELECTRONIC DEVICE

CROSS-REFERENCE TO RELATED APPLICATION

This application claims the priority benefit of Taiwan application serial no. 107120717, filed on Jun. 15, 2018. The entirety of the above-mentioned patent application is hereby incorporated by reference herein and made a part of this specification.

Technical Field

The disclosure relates to an electronic device; more particularly, the disclosure relates to an electronic device including a circuit board.

Description of Related Art

With the advantages of high contrast, high brightness, high color saturation, and wide view angle of the conventional flat panel display, an ultra-high definition (UHD) flat panel display is rapidly emerging. On the premise that the image quality of the flat panel display need be upgraded to have UHD, the number of pads located around the flat panel display and configured to connect the circuit board is bound to increase, so that the pitch between every two adjacent pads is reduced. When the pitch between every two adjacent pads is overly small, which compromises the manufacturing capability of the existing production machine, the bonding yield of the circuit board and the pads of the flat panel display is significantly reduced. Hence, how to take both the improvement of the bonding yield of the flat panel display and the UHD into account is an issue to be solved by various manufacturers.

SUMMARY

The disclosure provides an electronic device with high bonding yield.

In an embodiment, an electronic device includes a substrate, a plurality of first signal lines, a plurality of pixel structures, a plurality of first pads, a plurality of transmission pads, a first combination circuit board, and a transmission circuit board. The substrate has a first side and a second side opposite to each other. The first signal lines are arranged in a first direction between the first side and the second side of the substrate and extend along a second direction. The pixel structures are electrically connected to the first signal lines. The first pads are disposed on the substrate and electrically connected to some of the first signal lines. The transmission pads are disposed on the substrate and electrically connected to some of the first signal lines. The first combination circuit board is disposed between the first side and the second side of the substrate. The transmission circuit board is disposed between the first combination circuit board and the second side of the substrate. The first combination circuit board is electrically connected to at least some of the first pads, and in the first direction, a first pitch exists between two adjacent first pads. The transmission circuit board is electrically connected to the transmission pads. In the first direction, a transmission-pad pitch exists between two adjacent transmission pads, and the transmission-pad pitch is greater than the first pitch.

According to an embodiment, the electronic device further includes a plurality of second pads disposed on the substrate and located between the first pads and the first side of the substrate. The first combination circuit board is electrically connected to at least some of the second pads. In the first direction, a second pitch exists between two adjacent second pads, and the second pitch is greater than the first pitch.

According to an embodiment, in the electronic device, a width of one of the second pads in the first direction is greater than a width of one of the first pads in the first direction.

According to an embodiment, the electronic device further includes a plurality of second signal lines and a first driving circuit. The second signal lines are disposed on the substrate, electrically connected to the pixel structures, and extend along the first direction. The first driving circuit is disposed next to the first side of the substrate and electrically connected to the second signal lines. The second pads electrically connected to the first combination circuit board are electrically connected to the first driving circuit.

According to an embodiment, the electronic device further includes a plurality of third pads disposed on the substrate and located between the first pads and the second side of the substrate. The first combination circuit board is bonded to at least some of the third pads.

According to an embodiment, the third pads of the electronic device are structurally not connected to the first signal lines. A third pitch exists between two adjacent third pads, and the third pitch is greater than the first pitch.

According to an embodiment, the third pads of the electronic device have a floating potential, a ground potential, or a combination thereof.

According to an embodiment, the electronic device further includes a second combination circuit board, a plurality of fourth pads, a plurality of fifth pads, and a second driving circuit. The second combination circuit board is disposed between the transmission circuit board and the second side of the substrate. The first pads include a first group of first pads and a second group of first pads. The first group of first pads are electrically connected to the first combination circuit board, and the second group of first pads are electrically connected to the second combination circuit board. The fourth pads are disposed between the second group of first pads and the transmission pads. The fourth pads are bonded second combination circuit board. The fifth pads are disposed between the second group of first pads and the second side of the substrate. The fifth pads are electrically connected to the second combination circuit board. The second driving circuit is disposed next to the second side of the substrate and electrically connected to the second signal lines. The fifth pads electrically connected to the second combination circuit board are electrically connected to the second driving circuit.

According to an embodiment, the fourth pads of the electronic device are structurally not connected to the first signal lines. In the first direction, a fourth pitch exists between two adjacent fourth pads, and the fourth pitch is greater than the first pitch. In the first direction, a fifth pitch exists between two adjacent fifth pads, and the fifth pitch is greater than the first pitch.

According to an embodiment, the fourth pads of the electronic device have a floating potential, a ground potential, or a combination thereof.

According to an embodiment, the transmission circuit board of the electronic device includes a first transmission circuit board and a second transmission circuit board disposed between the first combination circuit board and the second combination circuit board. The electronic device further includes a third combination circuit board and a plurality of sixth pads. The third combination circuit board is disposed between the first transmission circuit board and the second transmission circuit board. The first pads further include a third group of first pads electrically connected to the third combination circuit board. The sixth pads are disposed between the third group of first pads and the transmission pads and bonded to the third combination circuit board.

According to an embodiment, the sixth pads of the electronic device are structurally not connected to the first signal lines.

According to an embodiment, in the first direction, a sixth pitch exists between two adjacent sixth pads of the electronic device, and the sixth pitch is greater than the first pitch.

According to an embodiment, the transmission circuit board of the electronic device includes a first sub-transmission circuit board and a second sub-transmission circuit board located between the first combination circuit board and the second side of the substrate. The electronic device further includes a third combination circuit board and a plurality of sixth pads. The third combination circuit board is disposed between the first sub-transmission circuit board and the second sub-transmission circuit board. The first pads include a first group of first pads and a third group of first pads. The first group of first pads is electrically connected to the first combination circuit board, and the third group of first pads is electrically connected to the third combination circuit board. The sixth pads are disposed between the third group of first pads and the transmission pads and bonded to the third combination circuit board.

According to an embodiment, the sixth pads of the electronic device are structurally not connected to the first signal lines.

In view of the above, in the electronic device provided in an embodiment, the transmission-pad pitch is greater than the first pitch; hence, the transmission circuit board may be easily bonded to the transmission pads, so as to ensure the high bonding yield of the electronic device.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
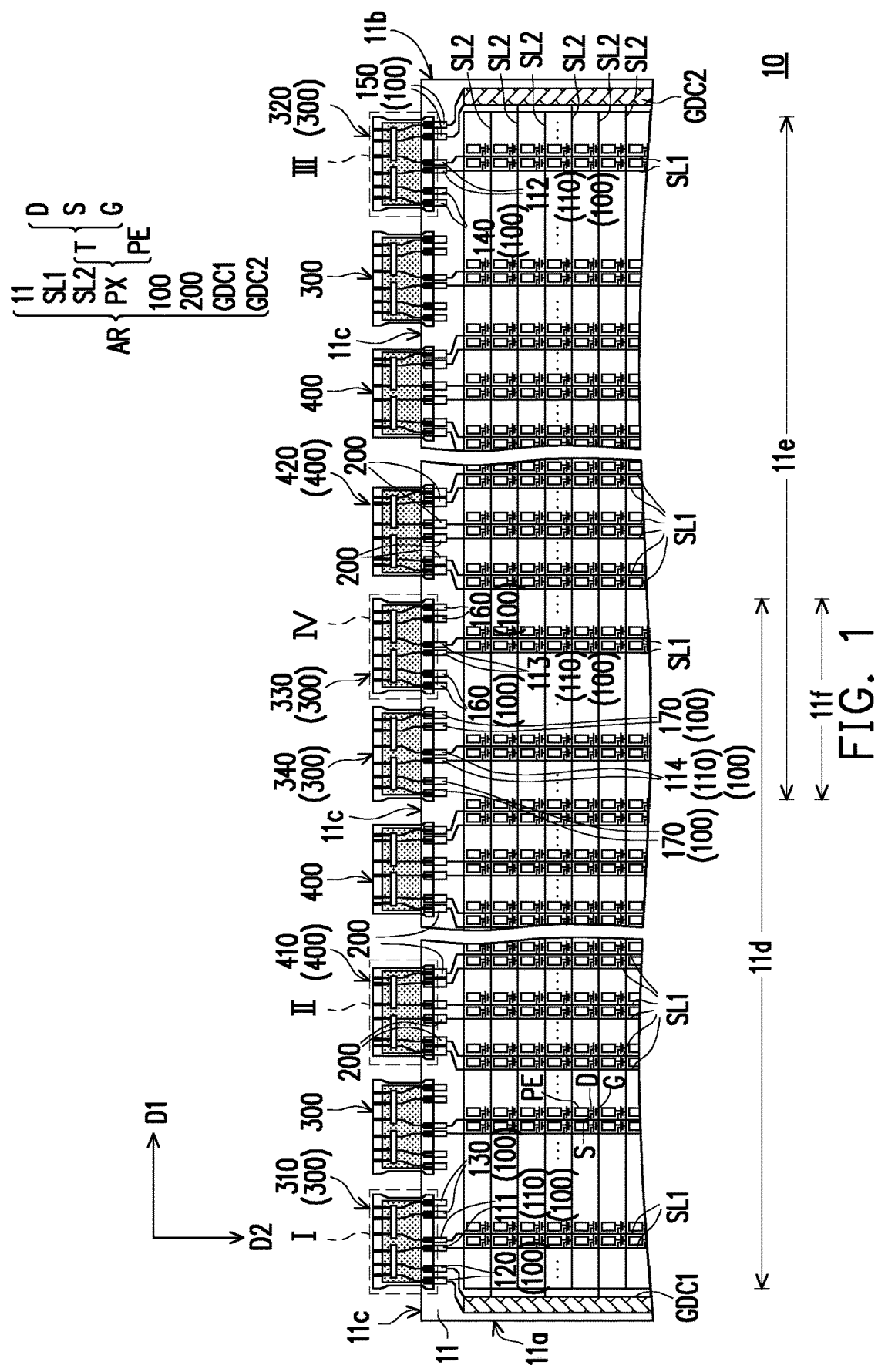
FIG. 1 is a schematic front view of an electronic device according to an embodiment of the invention.
Figure 3:
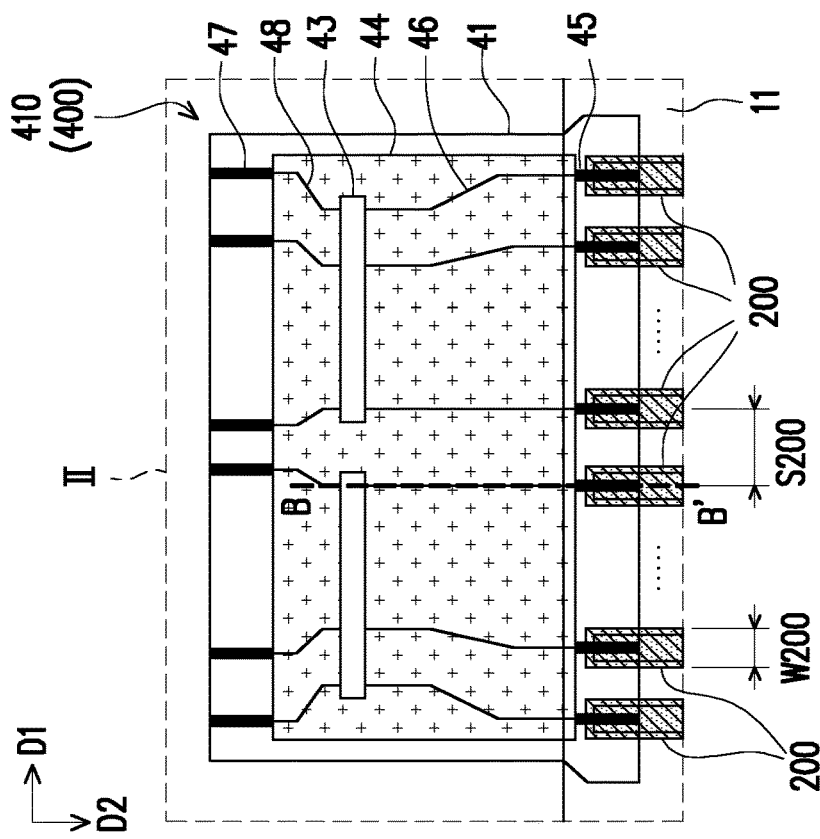
FIG. 3 is a schematic enlarged view of region II in an electronic device according to an embodiment of the invention.
Figure 2:
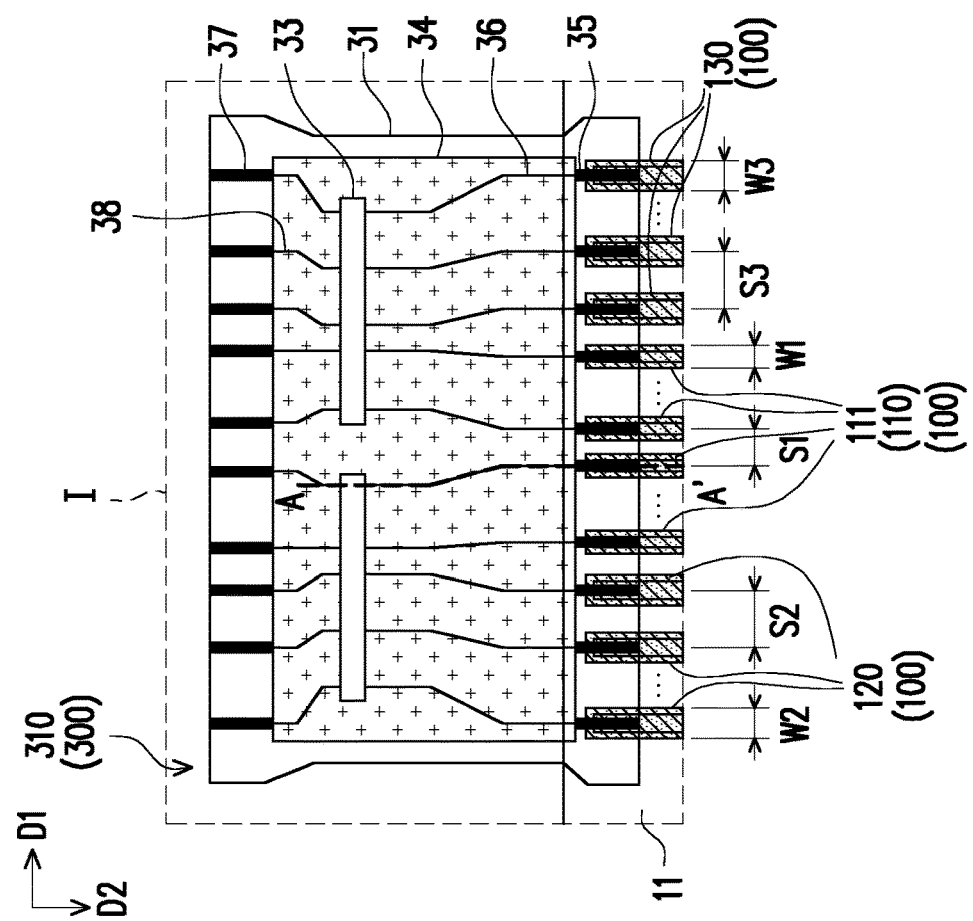
FIG. 2 is a schematic enlarged view of region I in an electronic device according to an embodiment of the invention.
Figure 4:
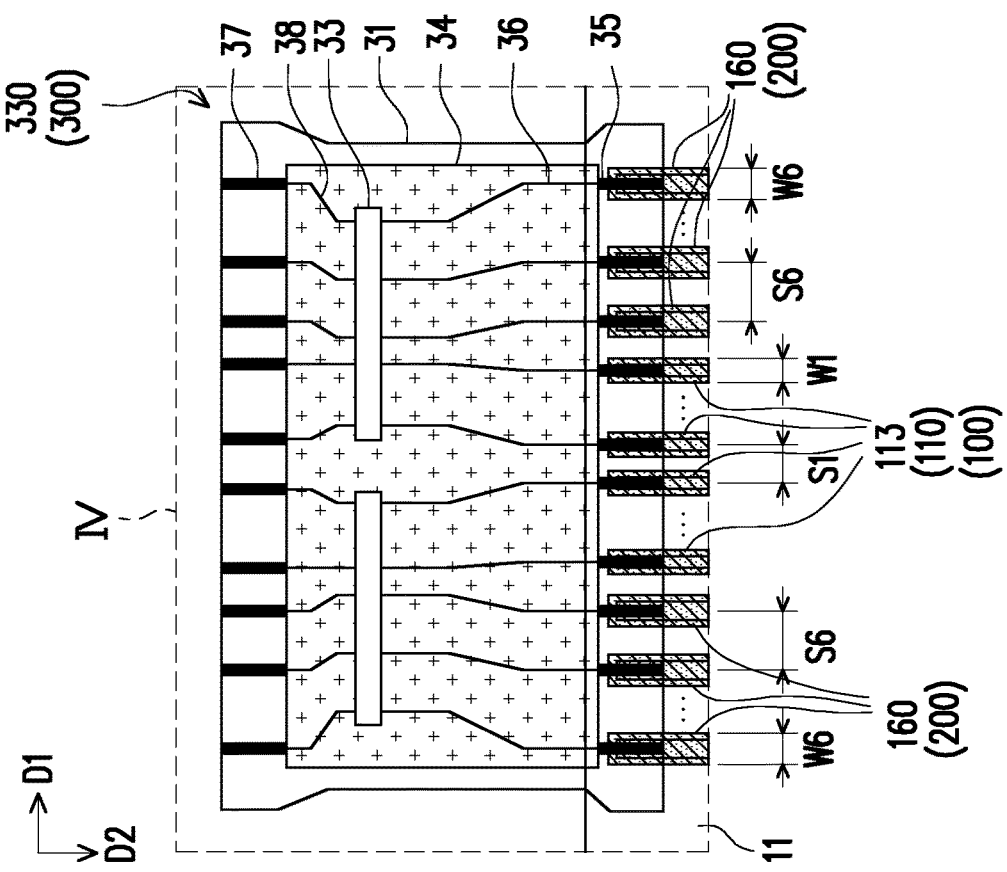
FIG. 4 is a schematic enlarged view of region III in an electronic device according to an embodiment of the invention.
Figure 5:
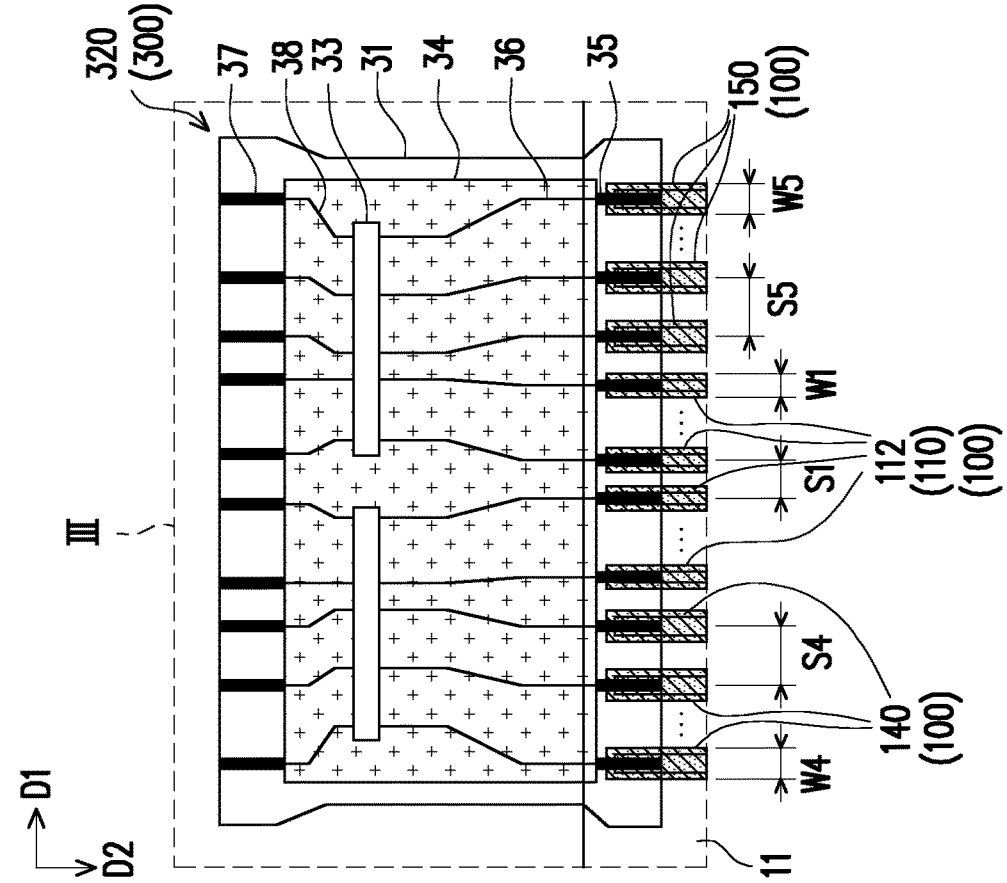
FIG. 5 is a schematic enlarged view of region IV in an electronic device according to an embodiment of the invention.
Figure 6:
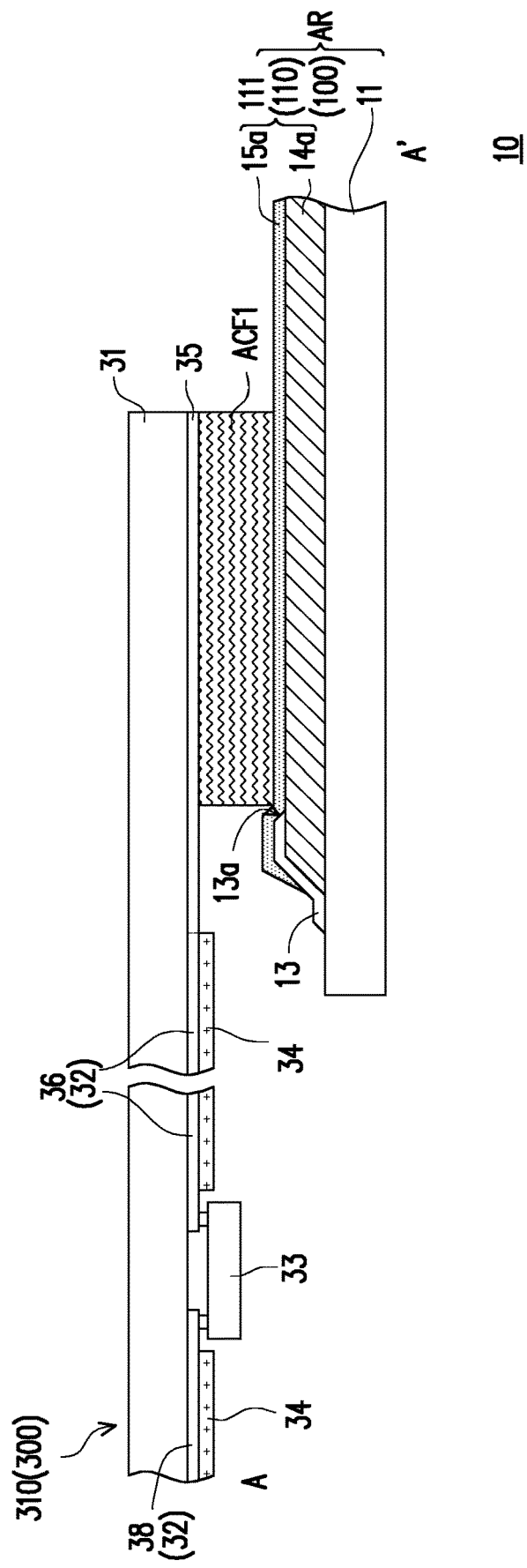
FIG. 6 is a schematic cross-sectional view of an electronic device according to an embodiment of the invention.
Figure 7:
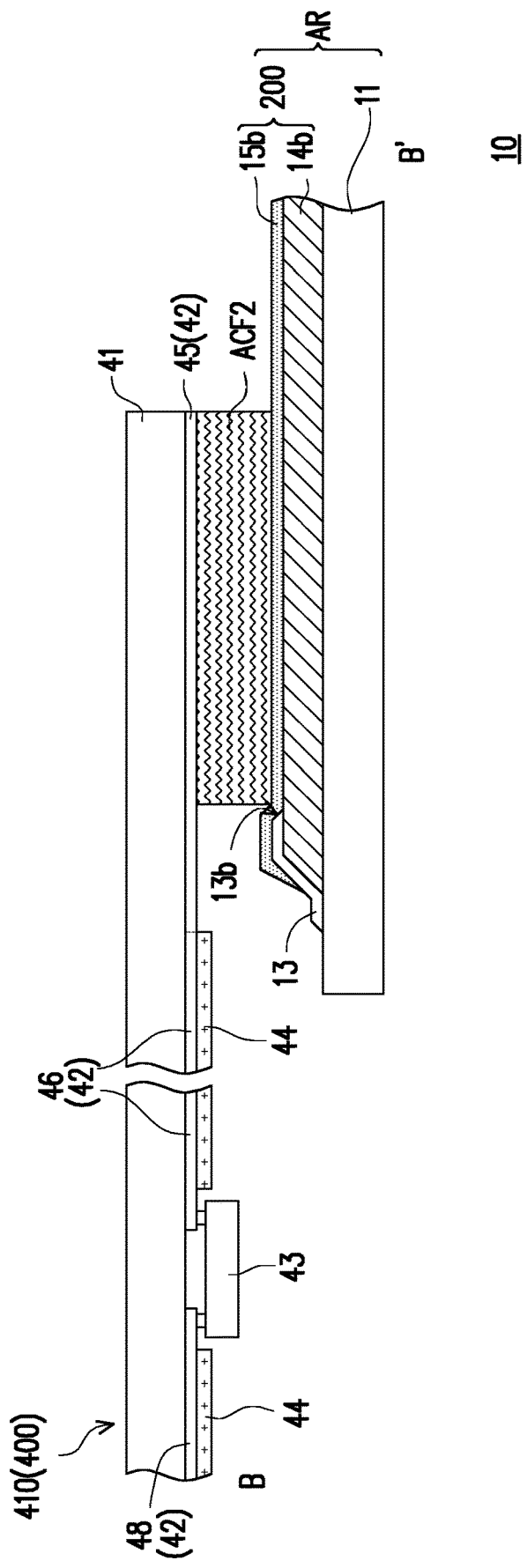
FIG. 7 is a schematic cross-sectional view of an electronic device according to an embodiment of the invention.

FIG. 1 is a schematic front view of an electronic device according to an embodiment of the invention. FIG. 2 is a schematic enlarged view of region I in an electronic device according to an embodiment of the invention. FIG. 3 is a schematic enlarged view of region II in an electronic device according to an embodiment of the invention. FIG. 4 is a schematic enlarged view of region III in an electronic device according to an embodiment of the invention. FIG. 5 is a schematic enlarged view of region IV in an electronic device according to an embodiment of the invention. FIG. 6 is a schematic cross-sectional view of an electronic device according to an embodiment of the invention. Specifically, FIG. 6 corresponds to a sectional line A-A' depicted in FIG. 2. FIG. 7 is a schematic cross-sectional view of an electronic device according to an embodiment of the invention. Specifically, FIG. 7 corresponds to a sectional line B-B' depicted in FIG. 3. For clarity purposes, anisotropic conductive adhesives ACF1 and ACF2 are omitted from FIG. 1 to FIG. 5.

With reference to FIG. 1, the electronic device 10 includes a pixel array substrate AR. In the present embodiment, the pixel array substrate AR includes a substrate 11, a plurality of first signal lines SL1, a plurality of second signal lines SL2, and a plurality of pixel structures PX. The substrate 11 has a first side 11a and a second side 11b opposite to each other. The first signal lines SL1 are disposed on the substrate 11 and arranged in a first direction D1 between the first side 11a and the second side 11b. The second signal lines SL2 are disposed on the substrate 11 and arranged along a second direction D2. In the present embodiment, the first signal lines SL1 extend along the second direction D2, the second signal lines SL2 extend along the first direction D1, and the first direction D1 intersects the second direction D2. For instance, in the present embodiment, the first signal lines SL1 are, for instance, data lines, the second signal lines SL2 are, for instance, scan lines, and the first direction D1 may be perpendicular to the second direction D2, which should however not be construed as limitations in the disclosure.

For instance, the pixel structures PX may include active devices T and pixel electrodes PE. The active devices T are, for instance, thin film transistors and have sources S, drains D, and gates G The sources S of the active devices T are electrically connected to the corresponding first signal lines SL1. The gates G of the active devices T are electrically connected to the corresponding second signal lines SL2. The drains D of the active devices T are electrically connected to the corresponding pixel electrodes PE. In consideration of conductivity, the gates G, the sources S, the drains D, the first signal lines SL1, and the second signal lines SL2 are often made of metallic materials. However, the disclosure is not limited thereto. In other embodiments, the gates G, the sources S, the drains D, the first signal lines SL1, and the second signal lines SL2 may also be made of other conductive materials, such as alloy, metal nitride, metal oxide, metal oxynitride, another appropriate material, or a stacked layer containing metallic materials and other conductive materials. In the present embodiment, the pixel electrodes PE may be transmissive electrodes, and materials of the transmissive electrodes include metal oxide, such as indium-tin oxide (ITO), indium-zinc oxide (IZO), aluminum tin oxide (ATO), aluminum zinc oxide (AZO), other appropriate oxides, or a stacked layer containing at least two of the aforesaid materials. However, the disclosure is not limited thereto. According to other embodiments, the pixel electrodes PE may be reflective electrodes or a combination of reflective electrodes and transmissive electrodes.

With reference to FIG. 1, the pixel array substrate AR further includes a plurality of conductive pads 100 and a plurality of transmission pads 200 disposed on the substrate 11. For instance, in the present embodiment, the conductive pads 100 and the transmission pads 200 may be arranged in the first direction D1 between the first side 11a and the second side 11b of the substrate 11. Namely, the substrate 11 has a third side 11c connected between the first side 11a and the second side 11b, and the conductive pads 100 and the transmission pads 200 may be arranged along the third side 11c, which should however not be construed as limitations in the disclosure.

In the present embodiment, the electronic device 10 includes a plurality of separate combination circuit boards 300. The combination circuit boards 300 are bonded to the conductive pads 100. With reference to FIG. 1, FIG. 2, and FIG. 6, in the present embodiment, the combination circuit boards 300 include flexible substrates 31 and circuit layers 32 disposed on the flexible substrates 31. Namely, the combination circuit boards 300 are flexible printed circuit boards. In the present embodiment, the combination circuit boards 300 may selectively include driving chips 33 electrically connected to the circuit layers 32. For instance, according to the present embodiment, the driving chips 33 may be electrically connected to the circuit layers 32 in a flip-chip bonding manner, and the combination circuit boards 300 may be chips on film. However, the disclosure is not limited thereto. In other embodiments, the driving chips 33 may be electrically connected to the circuit layers 32 through applying other technologies, and the combination circuit boards 300 may be other types of packages. For instance, in another embodiment, the driving chips 33 may be electrically connected to the circuit layers 32 through tape automated bonding (TAB), and the combination circuit boards 300 may also be tape carrier packages (TCP). Whether the combination circuit boards 300 should include the driving chips or not is not limited herein. According to other embodiments, the combination circuit boards 300 may also be the flexible printed circuit boards not having the driving chips.

With reference to FIG. 2 and FIG. 6, for instance, in the present embodiment, the circuit layers 32 have a plurality of output leads 35, a plurality of input leads 37, a plurality of output traces 36, and a plurality of input traces 38. The output leads 35 and the input leads 37 are respectively located on two opposite sides of the driving chips 33. The output traces 36 are electrically connected between at least one of the driving chips 33 and the output leads 35. The output leads 35 are configured to be bonded to a plurality of conductive pads 100 of the pixel array substrate AR. The input traces 38 are electrically connected between at least one of the driving chips 33 and the input leads 37. The input leads 37 may be configured to be bonded to the printed circuit board (not shown). In the present embodiment, the combination circuit board 300 further include a solder mask layer 34 covering the output traces 36 and the input traces 38 and exposing the driving chips 33, the output leads 35, and the input leads 37.

With reference to FIG. 6, in the present embodiment, the conductive pads 100 may selectively include a plurality of conductive patterns 14a and 15a formed in different film layers. For instance, in the present embodiment, the conductive patterns 14a and the first signal lines SL1 may be formed in the same film layer, and the conductive patterns 15a and the pixel electrodes PE may be formed in the same film layer. The conductive patterns 14a and 15a are electrically connected to each other. Specifically, the pixel array substrate AR further includes an insulation layer 13 (shown in FIG. 6) disposed between the conductive patterns 14a and 15a, and the conductive pattern 15a may be electrically connected to the conductive pattern 14a through an opening 13a of the insulation layer 13. However, the disclosure is not limited thereto. In another embodiment, the conductive patterns 14a and 15a of the conductive pads 100 may be formed in other film layers; in still another embodiment, the conductive pads 100 may be constituted by one conductive pattern.

In the present embodiment, the electronic device 10 further includes a plurality of anisotropic conductive adhesives ACF1 (shown in FIG. 6). The output leads 35 of the combination circuit boards 300 may be electrically connected to the conductive pads 100 of the pixel array substrate AR through the anisotropic conductive adhesives ACF1. For instance, in the present embodiment, the anisotropic conductive adhesives ACF1 may be in direct contact with the conductive pattern 15a of the conductive pads 100, which should however not be construed as limitations in the disclosure.

With reference to FIG. 1, FIG. 3, and FIG. 7, the electronic device 10 further includes a transmission circuit board 400. The transmission circuit board 400 and the combination circuit boards 300 are separated from each other. The transmission circuit board 400 is bonded to the transmission pads 200. In the present embodiment, the transmission circuit board 400 includes a flexible substrate 41 and a circuit layer 42 disposed on the flexible substrate 41. That is, the transmission circuit board 400 is a flexible printed circuit board. According to the present embodiment, the transmission circuit board 400 may selectively include a driving chip 43 electrically connected to the circuit layer 42. For instance, according to the present embodiment, the driving chip 43 may be electrically connected to the circuit layer 42 in a flip-chip bonding manner, and the combination circuit board4 300 may be chip on film. However, the disclosure is not limited thereto. In other embodiments, the driving chip 43 may be electrically connected to the circuit layer 42 through applying other technologies, and the transmission circuit board 400 may be another type of package. For instance, in another embodiment, the driving chip 43 may be electrically connected to the circuit layer 42 through TAB, and the transmission circuit board 400 may also be a TCP. Whether the transmission circuit board 400 should include the driving chip or not is not limited herein. According to other embodiments, the transmission circuit board 400 may also be the flexible printed circuit board not having the driving chip.

With reference to FIG. 3 and FIG. 7, for instance, in the present embodiment, the circuit layer 42 has a plurality of output leads 45, a plurality of input leads 47, a plurality of output traces 46, and a plurality of input traces 48. The output leads 45 and the input leads 47 are respectively located on two opposite sides of the driving chip 43. The output traces 46 are electrically connected between at least one driving chip 43 and the output leads 45. The output leads 45 are configured to be bonded to a plurality of transmission pads 200 of the pixel array substrate AR. The input traces 48 are electrically connected between at least one driving chip 43 and the input leads 47. The input leads 47 may be configured to be bonded to the printed circuit board (not shown). In the present embodiment, the transmission circuit board 400 further includes a solder mask layer 44 covering the output traces 46 and the input traces 48 and exposing the driving chip 43, the output leads 45, and the input leads 47.

In the present embodiment, the transmission pads 200 may selectively include a plurality of conductive patterns 14b and 15b formed in different film layers. For instance, in the present embodiment, the conductive patterns 14b and the first signal lines SL1 may be formed in the same film layer, and the conductive patterns 15b and the pixel electrodes PE may be formed in the same film layer. The conductive patterns 14b and 15b are electrically connected to each other. Specifically, the pixel array substrate AR further includes an insulation layer 13 (shown in FIG. 10) disposed between the conductive patterns 14b and 15b, and the conductive pattern 15b may be electrically connected to the conductive pattern 14b through an opening 13b of the insulation layer 13. However, the disclosure is not limited thereto. In another embodiment, the conductive patterns 14b and 15b of the transmission pads 200 may be formed in other film layers; in still another embodiment, the transmission pads 200 may be constituted by one conductive pattern.

In the present embodiment, the electronic device 10 further includes a plurality of anisotropic conductive adhesives ACF2 (shown in FIG. 7). The output leads 45 of the transmission circuit board 400 may be electrically connected to the transmission pads 200 through the anisotropic conductive adhesives ACF2. For instance, in the present embodiment, the anisotropic conductive adhesives ACF2 may be in direct contact with the conductive pattern 15b of the transmission pads 200, which should however not be construed as limitations in the disclosure.

With reference to FIG. 1, FIG. 2, and FIG. 3, in the present embodiment, the outer shape of the combination circuit boards 300 may be selectively different from the outer shape of the transmission circuit board 400 的, which allows the staff or the machine for better identification and to further bond the combination circuit boards 300 to the corresponding conductive pads 100 as well as bond the transmission circuit board 400 to the corresponding transmission pads 200. However, the disclosure is not limited thereto. In other embodiments, the outer shape of the combination circuit boards 300 may be the same as the outer shape of the transmission circuit board 400.

With reference to FIG. 1 and FIG. 2, in the present embodiment, the conductive pads 100 include the first pads 110 electrically connected to some of the first signal lines SL. The combination circuit boards 300 include a first combination circuit board 310 disposed between the first side 11a and the second side 11b of the substrate 11. The first combination circuit board 310 is electrically connected to at least some of the first pads 110 (e.g., the first group of first pads 111). With reference to FIG. 1 and FIG. 3, the transmission circuit board 400 is electrically connected to the transmission pads 200. The transmission circuit board 400 includes a first sub-transmission circuit board 410 disposed between the first combination circuit board 310 and the second side 11b of the substrate 11. With reference to FIG. 1, FIG. 2, and FIG. 3, in the first direction D1, a first pitch S1 exists between two adjacent first pads 110 electrically connected to the first combination circuit board 310, a transmission-pad pitch S200 exists between two adjacent transmission pads 200 electrically connected to the first sub-transmission circuit board 410, and the transmission-pad pitch S200 is greater than the first pitch S1.

In the present embodiment, two adjacent transmission pads 200 have a transmission-pad pitch S200 therebetween, and the transmission-pad pitches S200 are substantially equal. That is, in the present embodiment, the transmission pads 200 are arranged with the same pitch (i.e., the transmission-pad pitch S200) therebetween; however, the disclosure is not limited thereto. In an embodiment, the first pitch S1 between two adjacent first pads 110 may have a maximum value, the transmission-pad pitch S200 between two adjacent transmission pads 200 may have a maximum value as well, and the maximum first pitch S1 is greater than the maximum transmission-pad pitch 200S. In an embodiment, the first pitch S1 between two adjacent first pads 110 may have an average value, the transmission-pad pitch S200 between two adjacent transmission pads 200 may have an average value as well, and the average first pitch S1 is greater than the average transmission-pad pitch 200S. Besides, according to the present embodiment, the transmission pads 200 have a width W200 in the first direction D1, the first pads 110 have a width W1 in the first direction D1, and the width W200 of the transmission pads 200 may be greater than the width W1 of the first pads 110, which should however not be construed as a limitation in the disclosure.

With reference to FIG. 1 and FIG. 2, in the present embodiment, the conductive pads 100 further include the second pads 120 disposed between the first pads 110 and the first side 11a of the substrate 11. The first combination circuit board 310 is further electrically connected to at least some of the second pads 120. In the first direction D1, a second pitch S2 exists between two adjacent second pads 120, and the second pitch S2 is greater than the first pitch S1. Besides, a width W1 of one of the second pads 120 in the first direction D1 is greater than a width W1 of one of the first pads 110 in the first direction D1, which should however not be construed as a limitation in the disclosure.

With reference to FIG. 1, in the present embodiment, the pixel array substrate AR further includes a first driving circuit GDC1, which is a gate driver on array (GOA), for instance. That is, in the present embodiment, the active device (not shown) of the first driving circuit GDC1 and the active device T of the pixel structure PX are manufactured together. The driving circuit GDC1 is disposed next to the first side 11a of the substrate 11 and is electrically connected to at least some of the second signal lines SL2. The second pads 120 electrically connected to the first combination circuit board 310 are electrically connected to the first driving circuit GDC1.

With reference to FIG. 1 and FIG. 2, in the present embodiment, the conductive pads 100 further include a plurality of third pads 130 located between the first pads 110 and the second side 11b of the substrate 11. The first combination circuit board 310 is bonded to at least some of the third pads 130. A third pitch S3 exists between two adjacent third pads 130, and the third pitch S3 is greater than the first pitch S1. In the present embodiment, the second pitch S2 may be substantially equal to the third pitch S3, which should however not be construed as a limitation in the disclosure. Besides, a width W3 of one of the third pads 130 in the first direction D1 is greater than the width W1 of one of the first pads 110 in the first direction D1, which should however not be construed as a limitation in the disclosure. In the present embodiment, the width W2 and the width W3 may be substantially equal, which should however not be construed as a limitation in the disclosure.

With reference to FIG. 1, the third pads 130 are structurally not connected to the first signal lines SL1. Namely, the third pads 130 are dummy pads. The third pads 130 may have a floating potential, a ground potential, or a combination thereof, which should not be construed as a limitation in the disclosure.

With reference to FIG. 1 and FIG. 4, in the present embodiment, the combination circuit boards 300 further include a second combination circuit board 320 disposed between the transmission circuit board 400 (e.g., the first sub-transmission circuit board 410) and the second side 11b of the substrate 11. The first pads 110 further include a second group of first pads 112 electrically connected to the second combination circuit board 320. The second combination circuit board 320 is separated from the first combination circuit board 310 and the transmission circuit board 400. The transmission circuit board 400 is disposed between the first combination circuit board 310 and the second combination circuit board 320. In the present embodiment, the conductive pads 100 further include a plurality of fourth pads 140 disposed between the second group of first pads 112 and the transmission pads 200. The fourth pads 140 are bonded to the second combination circuit board 320. In the present embodiment, in the first direction D1, a fourth pitch S4 exists between two adjacent fourth pads 140, and the fourth pitch S4 may be greater than the first pitch S1, which should however not be construed as a limitation in the disclosure. Besides, according to the present embodiment, each fourth pad 140 has a width W4 in the first direction D1, and the width W4 may be greater than the width W1, which should however not be construed as a limitation in the disclosure.

In the present embodiment, the fourth pads 140 are structurally not connected to the first signal lines SL1. Namely, the fourth pads 140 are dummy pads. The fourth pads 140 may have a floating potential, a ground potential, or a combination thereof, which should not be construed as a limitation in the disclosure.

With reference to FIG. 1 and FIG. 4, in the present embodiment, the conductive pads 100 further include a plurality of fifth pads 150 located between the second group of first pads 112 and the second side 11b of the substrate 11. The fifth pads 150 are electrically connected to the second combination circuit board 320. According to an embodiment, in the first direction D1, a fifth pitch S5 exists between two adjacent fifth pads 150, and the fifth pitch S5 may be greater than the first pitch S1, which should however not be construed as a limitation in the disclosure. In the present embodiment, the fourth pitch S4 and the fifth pitch S5 may be substantially equal, which should however not be construed as a limitation in the disclosure. Besides, according to the present embodiment, each fifth pad 150 has a width W5 in the first direction D1, and the width W5 may be greater than the width W1 and substantially equal to the width W4, which should however not be construed as a limitation in the disclosure. In other embodiments, the width W4 and the width W5 may be substantially equal to the width W2 (shown in FIG. 2) or the width W3 (shown in FIG. 2), which should however not be construed as a limitation in the disclosure.

With reference to FIG. 1, in the present embodiment, the pixel array substrate AR further includes a second driving circuit GDC2. The second driving circuit GDC2 is, for instance, a GOA; in other words, the active device (not shown) of the second driving circuit GDC2 and the active device T of the pixel structure PX are manufactured together. The second driving circuit GDC2 is disposed next to the second side 11b of the substrate 11 and electrically connected to at least some of the second signal lines SL2. The fifth pads 150 electrically connected to the second combination circuit board 320 may be electrically connected to the second driving circuit GDC2.

With reference to FIG. 1, the transmission circuit board 400 includes a first sub-transmission circuit board 410 and a second sub-transmission circuit board 420 which are disposed between the first combination circuit board 310 and the second side 11b of the substrate 11. For instance, in the present embodiment, the first sub-transmission circuit board 410 and the second sub-transmission circuit board 420 may be disposed between the first combination circuit board 310 and the second combination circuit board 320, which should however not be construed as a limitation in the disclosure. The combination circuit boards 300 further include a third combination circuit board 330 disposed between the first sub-transmission circuit board 410 and the second sub-transmission circuit board 420. The first pads 110 further include a third group of first pads 113 electrically connected to the third combination circuit board 330. The conductive pads 100 further include a plurality of sixth pads 160 disposed between the third group of first pads 113 and the transmission pads 200. The sixth pads 160 are bonded to third combination circuit board 330. With reference to FIG. 1 and FIG. 5, in the present embodiment, a sixth pitch S6 exists between two adjacent sixth pads 160, and the sixth pitch S6 may be greater than the first pitch S1, which should however not be construed as a limitation in the disclosure. In the present embodiment, each sixth pad 160 has a width W6 in the first direction D1, and the width W6 may be greater than the width W1 and may be substantially equal to the width W2 or the width W3, which should however not be construed as a limitation in the disclosure.

With reference to FIG. 1, in the present embodiment, the sixth pads 160 are structurally not connected to the first signal lines SL1. Namely, the sixth pads 160 are dummy pads. The sixth pads 160 may have a floating potential, a ground potential, or a combination thereof, which should not be construed as a limitation in the disclosure.

With reference to FIG. 1, in the present embodiment, the combination circuit boards 300 further include a fourth combination circuit board 340 disposed between the third combination circuit board 330 and the transmission circuit board 400 (e.g., the first sub-transmission circuit board 410). The first pads 110 further include a fourth group of first pads 114 electrically connected to the fourth combination circuit board 340. The fourth combination circuit board 340 is separated from the first combination circuit board 310, the second combination circuit board 320, the third combination circuit board 330, and the transmission circuit board 400. The conductive pads 100 further include a plurality of seventh pads 170 disposed between the fourth group of first pads 114 and the transmission pads 200. The seventh pads 170 are bonded to the fourth combination circuit board 340. In the present embodiment, the seventh pads 170 are structurally not connected to the first signal lines SL1. Namely, the seventh pads 170 are dummy pads. The seventh pads 170 may have a floating potential, a ground potential, or a combination thereof, which should not be construed as a limitation in the disclosure.

With reference to FIG. 1, in the present embodiment, components of the pixel array substrate AR on the substrate 11 (e.g., the conductive pads 100 and the transmission pads 200 located between the first side 11a and the second side 11b) may be selectively formed through applying a sequent exposure method. For instance, the substrate 11 includes different regions 11*d* and 11*e* that are partially overlapped, and the sequent exposure method includes following steps. An exposure source and a photomask are provided, wherein the light emitted by the exposure source passes through the photomask and is projected on the substrate 11. The resultant projection area is smaller than the area occupied by the to-be-formed components. At least one film layer to which the conductive pads 100 and the transmission pads 200 belong (e.g., the film layer to which the conductive pattern 14*a* or the conductive pattern 15*a* belongs) is formed within the region 11*d* of the substrate 11 by applying the photomask, and the at least one film layer is formed within the region 11*e* of the substrate 11 by applying the same photomask. Here, a region where the regions 11*d* and 11*e* are overlapped is 11*f*, and the region 11*f* undergoes multiple exposure. In the process of multiple exposures, the components formed in the region 11*f* are required to have the same pattern. Hence, in the present embodiment, the conductive pads 100 (e.g., the third group of first pads 113 and the fourth group of first pads 114) corresponding to at least one combination circuit board (e.g., the third combination circuit board 330 and the fourth combination circuit board 340) exist between the transmission pads 200 corresponding to the first sub-transmission circuit board 410 and the second sub-transmission circuit board 420. However, the disclosure is not limited thereto. According to other embodiments, if forming the components of the pixel array substrate AR does not require the sequent exposure method, there may be no conductive pads 100 between the first sub-transmission circuit board 410 and the second sub-transmission circuit board 420.

Figure 8:
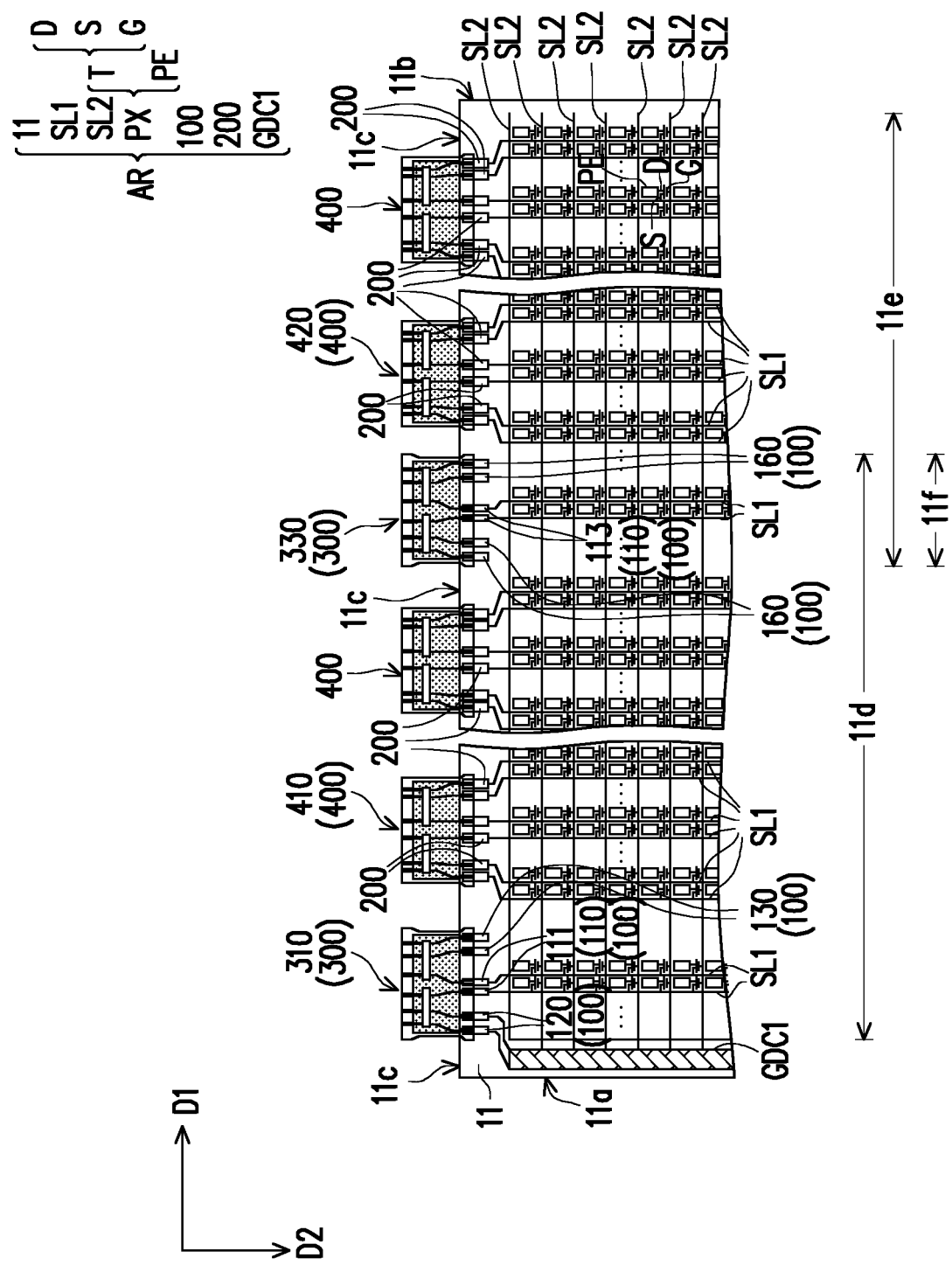
FIG. 8 is a schematic front view of an electronic device according to another embodiment of the invention.

With reference to FIG. 1, according to the present embodiment, some of the second signal lines SL2 (e.g., odd number of the second signal lines SL2) are electrically connected to the first driving circuit GDC1, and the other second signal lines SL2 (e.g., even number of the second signal lines SL2) are electrically connected to the second driving circuit GDC2. That is, the GOA is disposed on two sides of the substrate 11. Nevertheless, the disclosure should not be construed as limited to the embodiments set forth herein. FIG. 8 is a schematic front view of an electronic device according to another embodiment of the invention. As shown in FIG. 8, the GOA may also be disposed next to one side of the substrate 11, i.e., disposed next to the first side 11*a* of the substrate 11. At this time, the second combination circuit board 320 disposed next to the second side 11*b* of the substrate 11 may be omitted, so as to further improve the bonding yield. Besides, in still another embodiment, when the GOA is disposed next to one side of the substrate 11 (e.g., next to the first side 11*a*), the conductive pads 100 bonded to the combination circuit board 300 may selectively not include the dummy pads next to the other side (e.g., the second side 11*b*) of the substrate 11. For instance, in still another embodiment, the conductive pads 100 bonded to the first combination circuit board 310 may selectively not include the third pads 130 depicted in FIG. 8, and the conductive pads 100 bonded to the third combination circuit board 330 may selectively not include the sixth pads 160 located on the right of the third group of first pads 113 shown in FIG. 8.

To sum up, the electronic device provided in one or more embodiments of the invention includes the first pads electrically connected to some of the first signal lines, the transmission pads electrically connected to some of the first signal lines, the first combination circuit board, and the transmission circuit board. The first combination circuit board is disposed between the first side and the second side of the substrate. The first combination circuit board is electrically connected to at least some of the first pads. The transmission circuit board is disposed between the first combination circuit board and the second side of the substrate. The transmission circuit board is electrically connected to the transmission pads. In the first direction, the first pitch exists between two adjacent first pads, the transmission-pad pitch exists between two adjacent transmission pads, and the transmission-pad pitch is greater than the first pitch. Since the transmission-pad pitch is greater than the first pitch, the transmission circuit board may be easily bonded to the transmission pads, so as to ensure the high bonding yield of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic device, comprising:
a substrate having a first side and a second side opposite to each other;
a plurality of first signal lines arranged along a first direction between the first side and the second side of the substrate and extending along a second direction;
a plurality of pixel structures electrically connected to the plurality of first signal lines;
a plurality of first pads disposed on the substrate and electrically connected to some of the plurality of first signal lines;
a plurality of transmission pads disposed on the substrate and electrically connected to some of the plurality of first signal lines;
a first combination circuit board disposed between the first side and the second side of the substrate, wherein the first combination circuit board is electrically connected to at least some of the plurality of first pads, and a first pitch is between two adjacent first pads of the plurality of first pads in the first direction;
a transmission circuit board disposed between the first combination circuit board and the second side of the substrate, wherein the transmission circuit board is electrically connected to the plurality of transmission pads, a transmission-pad pitch is between two adjacent transmission pads of the plurality of transmission pads in the first direction, and the transmission-pad pitch is greater than the first pitch;
a plurality of second pads disposed on the substrate and located between the plurality of first pads and the first side of the substrate, wherein the first combination circuit board is electrically connected to at least some of the plurality of second pads, a second pitch is between two adjacent second pads of the plurality of second pads in the first direction, and the second pitch is greater than the first pitch;
a plurality of second signal lines disposed on the substrate, electrically connected to the plurality of pixel structures, and extending in the first direction;
a first driving circuit located next to the first side of the substrate and electrically connected to the plurality of second signal lines, the plurality of second pads electrically connected to the first combination circuit board being electrically connected to the first driving circuit; and a plurality of third pads disposed on the substrate and located between the plurality of first pads and the second side of the substrate, wherein the first combination circuit board is bonded to at least some of the plurality of third pads.

2. The electronic device as recited in claim 1, wherein a width of one of the plurality of second pads in the first direction is greater than a width of one of the plurality of first pads in the first direction.

3. The electronic device as recited in claim 1, wherein the plurality of third pads are structurally not connected to the plurality of first signal lines, a third pitch exists between two adjacent third pads of the plurality of third pads, and the third pitch is greater than the first pitch.

4. The electronic device as recited in claim 3, wherein the second pitch is substantially equal to the third pitch.

5. The electronic device as recited in claim 3, wherein the plurality of third pads include a floating potential, a ground potential, or a combination thereof.

6. The electronic device as recited in claim 1, further comprising:
   a second combination circuit board disposed between the transmission circuit board and the second side of the substrate, the plurality of first pads comprising a first group of first pads and a second group of first pads, wherein the first group of first pads is electrically connected to the first combination circuit board, and the second group of first pads is electrically connected to the second combination circuit board;
   a plurality of fourth pads disposed between the second group of first pads and the plurality of transmission pads, the plurality of fourth pads being bonded to the second combination circuit board;
   a plurality of fifth pads disposed between the second group of first pads and the second side of the substrate, the plurality of fifth pads being electrically connected to the second combination circuit board; and
   a second driving circuit located next to the second side of the substrate and electrically connected to the plurality of second signal lines, the plurality of fifth pads electrically connected to the second combination circuit board being electrically connected to the second driving circuit.

7. The electronic device as recited in claim 6, wherein
   the plurality of fourth pads are structurally not connected to the plurality of first signal lines, a fourth pitch exists between two adjacent fourth pads of the plurality of fourth pads in the first direction, and the fourth pitch is greater than the first pitch; and
   in the first direction, a fifth pitch exists between two adjacent fifth pads of the plurality of fifth pads, and the fifth pitch is greater than the first pitch.

8. The electronic device as recited in claim 7, wherein the plurality of fourth pads include a floating potential, a ground potential, or a combination thereof.

9. The electronic device as recited in claim 6, wherein the transmission circuit board comprises a first sub-transmission circuit board and a second sub-transmission circuit board disposed between the first combination circuit board and the second combination circuit broad, and the electronic device further comprises:
   a third combination circuit board disposed between the first sub-transmission circuit board and the second sub-transmission circuit board, the plurality of first pads further comprising a third group of first pads electrically connected to the third combination circuit board; and
   a plurality of sixth pads disposed between the third group of first pads and the plurality of transmission pads, the plurality of sixth pads being bonded to the third combination circuit board.

10. The electronic device as recited in claim 9, wherein the plurality of sixth pads are structurally not connected to the plurality of first signal lines.

11. The electronic device as recited in claim 9, wherein a sixth pitch exists between two adjacent sixth pads of the plurality of sixth pads in the first direction, and the sixth pitch is greater than the first pitch.

12. The electronic device as recited in claim 1, wherein the transmission circuit board comprises a first sub-transmission circuit board and a second sub-transmission circuit board located between the first combination circuit board and the second side of the substrate, and the electronic device further comprises:
   a third combination circuit board disposed between the first sub-transmission circuit board and the second sub-transmission circuit board, the plurality of first pads comprising a first group of first pads and a third group of first pads, wherein the first group of first pads is electrically connected to the first combination circuit board, and the third group of first pads is electrically connected to the third combination circuit board; and
   a plurality of sixth pads disposed between the third group of first pads and the plurality of transmission pads, the plurality of sixth pads being bonded to the third combination circuit board.

13. The electronic device as recited in claim 12, wherein the plurality of sixth pads are structurally not connected to the plurality of first signal lines.

14. An electronic device, comprising:
   a substrate having a first side and a second side opposite to each other;
   a plurality of first signal lines arranged along a first direction between the first side and the second side of the substrate and extending along a second direction;
   a plurality of pixel structures electrically connected to the plurality of first signal lines;
   a plurality of first pads disposed on the substrate and electrically connected to some of the plurality of first signal lines;
   a plurality of transmission pads disposed on the substrate and electrically connected to some of the plurality of first signal lines;
   a first combination circuit board disposed between the first side and the second side of the substrate, wherein the first combination circuit board is electrically connected to at least some of the plurality of first pads, and a first pitch is between two adjacent first pads of the plurality of first pads in the first direction;
   a transmission circuit board disposed between the first combination circuit board and the second side of the substrate, wherein the transmission circuit board is electrically connected to the plurality of transmission pads, a transmission-pad pitch is between two adjacent transmission pads of the plurality of transmission pads in the first direction, and the transmission-pad pitch is greater than the first pitch;
   a plurality of second pads disposed on the substrate and located between the plurality of first pads and the first side of the substrate, wherein the first combination circuit board is electrically connected to at least some of the plurality of second pads, a second pitch is between two adjacent second pads of the plurality of second pads in the first direction, and the second pitch is greater than the first pitch;

a plurality of second signal lines disposed on the substrate, electrically connected to the plurality of pixel structures, and extending in the first direction; and a first driving circuit located next to the first side of the substrate and electrically connected to the plurality of second signal lines, the plurality of second pads electrically connected to the first combination circuit board being electrically connected to the first driving circuit.

* * * * *